Jan. 5, 1960 E. E. PENTECOST 2,920,280

HIGH SELECTIVITY REJECT NETWORK

Filed April 30, 1956

INVENTOR.
EUGENE E. PENTECOST
BY William R Lane
ATTORNEY 2,920,280

HIGH SELECTIVITY REJECT NETWORK

Eugene E. Pentecost, Long Beach, Calif., assignor to North American Aviation, Inc.

Application April 30, 1956, Serial No. 581,559
9 Claims. (Cl. 330—93)

This invention relates to electronic filter circuits and more particularly to an improved filter circuit for an A.-C. lead network.

In power amplifying automatic control systems for rotating an output shaft in correspondence with an arbitrary motion of an input shaft, commonly called servos, a high gain in the controller amplifier increases the speed of response of the servo system. However, a high gain in the controller amplifier tends to cause the servo to oscillate. Accordingly, electronic lead networks are included in servo systems to permit the gain to be increased without sustained oscillations occurring. A lead network produces a leading phase shift of the error signal within the band of frequencies in which oscillation is possible, thus compensating for the phase lag in other parts of the controller of the servo system.

A.-C. lead networks operate upon an A.-C. carrier signal modulated by an error signal. Since the values of error signals are usually of low frequency compared to the carrier frequency, a lead network is required which filters out narrow band width around the carrier frequency and allows the side band frequencies carrying the error signal to pass through the filter circuit with a phase shift.

In the past, the design of lead network circuits for low carrier frequencies involved the use of large and expensive high Q reactances to provide a filter circuit for sharply attenuating the carrier frequency while passing neighboring side band frequencies with comparatively little attenuation.

The circuit of this invention contemplates the use of an active network to supply energy to the filter circuit compensating for the internal resistance of the circuit thereby enhancing the figure of merit, or Q, and provides a circuit of narrow band width.

It is therefore an object of this invention to provide an improved frequency discriminator.

It is still another object of this invention to provide an electrical filter network with positive feedback to the tuning circuit.

It is a further object of this invention to provide a filter network with an improved figure of merit.

It is a further object of this invention to provide an amplifying circuit for rejecting signals of narrow band width.

It is still a further object of this invention to provide a circuit for attenuating carrier frequencies and passing side band frequencies of a carrier modulated wave.

Figure 1:
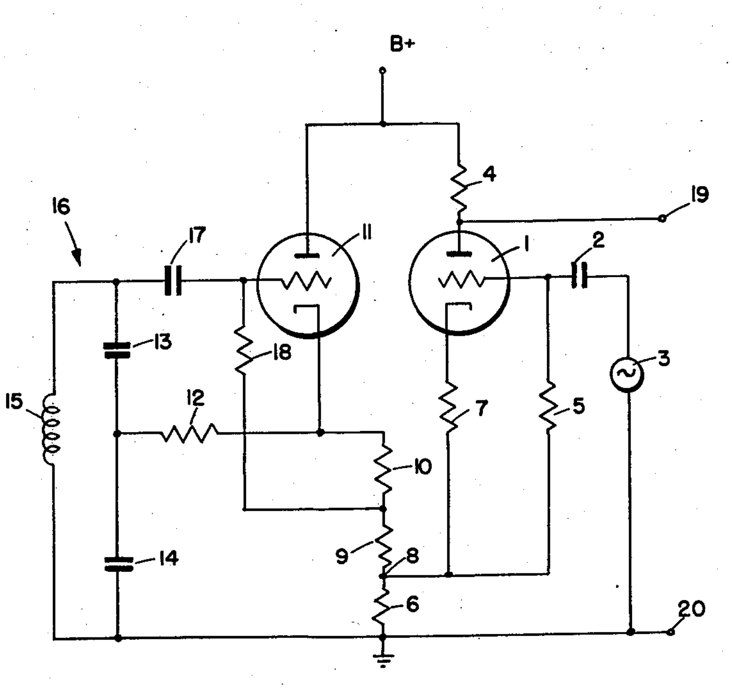
Figure 2:
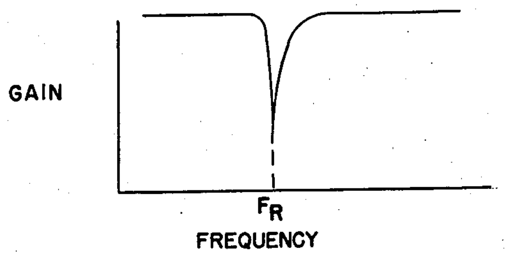

Other objects of invention will become apparent from the following description taken in connection with the accompanying drawings, in which Fig. 1 is a schematic diagram of the invention, and Fig. 2 is a graph of the filter network depicting the high Q characteristic.

Referring to Fig. 1, there is applied to the grid of triode 1 through coupling capacitor 2, an A.-C. source 3 which provides a carrier signal modulated by the error signal from the control transformer of the servo. The frequency of the carrier signal is usually of a substantially greater magnitude than the corresponding frequency of the error signal and may be, for example, 5000 c.p.s. as compared to an error signal which may be of the range of 20 to 100 c.p.s. Triode 1 acts as an amplifier having its anode connected through resistor 4 to a source of positive potential, and its grid returned through resistor 5 to point 8 for negative bias provided by resistor 7. The cathode resistance of triode 1 consists of resistors 7 and 6 connected in series to ground. The junction 8 thereof is connected through resistor 9 and 10 to the cathode of triode 11, having its anode connected to a source of positive potential. Triode 11 is coupled to triode 1 through resistor 6 in common with the cathode circuits of said triodes and operates as an amplifier of the cathode potential changes from triode 1 across resistor 6 in what is commonly referred to as a cathode follower circuit. Connected to the grid of triode 11 is a Q multiplier circuit consisting of a positive feedback resistor 12 inserted between the cathode of triode 11 and the common connection of capacitors 13 and 14 which, in parallel with reactance 15, form resonant circuit 16 tuned to the input carrier signal and coupled through capacitor 17 to the grid of triode 11. Resistor 18 connects the junction of resistors 9 and 10 to the grid of triode 11. Terminals 19 and 20 connected across the anode and ground of triode 1 provide the output signal of the circuit.

In operation, a carrier signal modulated by a low frequency error signal is applied to the grid of triode 1 through coupling capacitor 2. This signal is coupled to triode 11 through the cathode circuit formed by resistor 6 in common with the cathodes of triodes 1 and 11. The potential at point 8, in the cathode circuits of both triodes, tends to follow the input potential of the carrier modulated signal applied to the grid of triode 1. Triode 11, through the action of its parallel resonant circuit 16 and positive feedback network, attenuates the carrier error modulated signal and shifts it ahead by an interval of time determined by the time constant of parallel resonant circuit 16. At frequencies other than the resonant frequency, triode 11 has little effect on the output circuit of triode 1. At resonant frequency, however, the high impedance exhibited by circuit 16 connected to the grid of triode 11 causes the cathode potential of triode 11 to rise. This rise in potential is reflected to point 8 which, because it is also connected to the cathode of triode 1, causes a high impedance characteristic to be exhibited by resistor 6 to the cathode of triode 1, thereby sharply reducing the potential across points 19 and 20 in the output circuit. Operation of positive feedback resistor 12, which causes a negative resistance to be exhibited in series with the effective resistance of the resonant circuit 16, thereby causing the apparent Q of the resonant circuit to rise sharply, effectively narrowing the band width of frequencies passed by triode 1, will be explained more fully in relation to Fig. 2.

Turning now to Fig. 2, a frequency characteristic curve indicates the relation of gain of the output circuit at terminals 19 and 20 of triode 1 with respect to the input carrier frequencies. At $F_R$, the resonant frequency, which is equal to the frequency of the carrier signal 3, the gain of triode 1 approaches zero because of the effective high impedance at point 8. The narrowness of the band width of rejected frequencies shown in Fig. 2 is directly proportional to the figure of merit, or Q, of resonant frequency circuit 16. From amplifier theory it is well-known that by means of application of positive feedback in an ideal amplifier it is possible to obtain negative resistance. Positive feedback resistor 12 causes a negative resistance to be added to the internal resistance of resonant circuit 16. Since the Q of a resonant circuit is proportional to L/R of the circuit, it follows then that introducing a negative resistance 12 in series with the internal resistance of resonant circuit 16 raises the Q. Theoretically, it is possible to introduce a negative resistance equal to the resonant circuit resistance thereby making Q infinite. However, in order to meet conditions of stability, a value of resistor 12 is selected so that the internal resistance of resonant circuit 16 always slightly exceeds the negative resistance introduced from resistor 12. It is clear then from Fig. 2 and the above description that through positive feedback to resonant circuit 16, the Q of the circuit is greatly enhanced thereby providing a rejection circuit of narrow band width which filters out the carrier frequency while allowing side band frequencies close to the carrier frequency to pass. The circuit thus obtained, also known as a frequency notch network, sharply attenuates the input carrier signal and shifts the error modulation ahead an interval of time equal to the time constant of resonant circuit 16.

Although the invention has been described and illustrated in detail, it is to be clearly understood that the same is by way of illustration and example only and is not to be taken by way of limitation, the spirit and scope of this invention being limited only by the terms of the appended claims.

I claim:

1. In combination, a first electron tube having a cathode, a control grid, and an anode, said electron tube having input terminals connected to said grid and ground, respectively, and output terminals connected to said cathode and anode, respectively, an alternating potential signal having a range of frequencies including undesired carrier frequencies and desired side band frequencies connected across said input terminals, a second electron tube having a cathode, a control grid, and an anode, means for supplying a D.C. current to the anodes of said tubes, a resistor connected through a common connector of the cathodes of said tubes to ground, a parallel resonant circuit comprising an inductance shunted across two capacitors in series, said resonant circuit connected across the grid and ground of said second electron tube, positive feedback means comprising a resistor connected between the cathode of said second tube and the common connection of said two capacitors, said positive feedback means tending to decrease the resistance in said parallel resonant circuit thereby increasing the potential in the cathode of said second electron tube whereby said first electron tube is reduced in gain through said resistor in said common cathode connection at said undesired carrier frequency and produces an output at said desired side band frequencies.

2. A filter circuit comprising an electronic device having cathode, control, and anode electrodes, means for supplying operating potentials on said electrodes, said control electrode connected to receive an alternating current input signal of varying frequency, a resistive cathode circuit connecting said cathode to one side of said operating potential supply means, and negative resistance band reject filter means connected to said cathode for varying the impedance of said cathode circuit in accordance with the frequency of said input signal said filter means comprising a second electronic device having cathode, control and anode electrodes, a resonant circuit having an inductance shunted across two capacitors in series disposed between the control electrode of said second electronic device and ground, the common point of said capacitors in series being connected to one end of a positive feedback resistance, and the other end of said resistance being connected to the cathode of said second electronic device, and biasing resistor means for connecting the cathode of said second device to the cathode of said first device said anode electrode connected to present an alternating current output signal whose amplitude is proportional to the impedance of said cathode, said negative resistance band rejection filter means being disposed across ground and said resistive cathode circuit of said electronic device.

3. A frequency selective reject network, comprising an electronic amplifying device having at least a cathode a control electrode and an anode and a pair of output terminals connected respectively to said cathode and to said anode, and having input connections to said control electrode and to said cathode, means for receiving an electrical input signal at said control electrode and delivering an electrical output signal proportional to the product of said input signal and the amplification of said amplifying device at one of said output terminals, and frequency selective means in circuit with the other of said output terminals for changing the amplification factor of said amplifying device in response to a change in the frequency of said electrical input signal.

4. The combination recited in claim 3 wherein said frequency selective means comprising a second electronic amplifying device having at least a cathode a control electrode and an anode, said cathode and said anode comprising a pair of output electrodes connected in parallel with the output electrodes of said first electronic amplifying device and resonant circuit means connected between the control electrode and one of the output electrodes of said second amplifying device, said resonant circuit means responsive to a predetermined resonant frequency.

5. A filter circuit, comprising a first electronic device having a cathode, a control grid and an anode, a resistive cathode circuit connected between ground and the cathode of said first electronic device; means for establishing operating potentials on said cathode and anode; input connections disposed across said control grid and said resistive cathode circuit; output connections disposed across said anode and said resistive cathode circuit; a second electronic device having a cathode, a control grid and an anode; means for establishing operating potentials on said cathode and anode of said second electronics device; said control grid of said second electronic device being connected to said resistive cathode circuit of said first electronic device; band rejection means tuned to an operating carrier frequency and positive feedback means comprisng at least a resistive element connected between the cathode of the second tube and said band rejection means and to the grid of said second electronic device; means connected to said feedback means to vary the feedback in accordance with said operating carrier frequency; said feedback resistance cooperating with said tuned circuit means to produce a voltage gain at the control electrode of said second electronic device; first biasing means disposed in series with the cathode of said first electronic device; second biasing means disposed in series with the cathode of said second electronic device; and means for establishing a reference potential comprising a feedback resistance having one end joined to said first and second biasing means and having the end opposite thereto grounded.

6. In combination, a first electronic device having at least a cathode, a control grid and an anode; a first feedback resistance disposed between said cathode and ground; a second electronic device having at least a cathode, a control grid and an anode; means for establishing operating potentials on said anodes and said cathodes; input terminals connected across the grid of said first electronic device and said first feedback resistance; output terminals connected across the anode of said first electronic device and said first feedback resistance; tuned circuit means responsive to the carrier frequency of signals received by said input terminals; means comprising a positive feedback resistance for coupling the cathode of said second electronic device to said tuned circuit means; said positive feedback resistance cooperating with said tuned circuit means to produce a voltage gain at the control electrode of said second electronic device; and impedance means in series with the cathode of said first electronic device and said tuned circuit means, the value of said impedance means being variable in response to changes in the value of said tuned circuit means, whereby a high impedance is presented to the cathode of said first electronic device at the resonant frequency of said tuned circuit means.

7. In an electrical filter circuit: a first electron tube having at least a cathode, a control electrode, and an anode; means for impressing signals on said control electrode, said signals having a range of frequencies including undesired carrier frequencies and desired side band frequencies; a second electron tube having at least a cathode, a control electrode, and an anode; means for supplying positive potential to said anodes of said first and second electron tubes; resistance means for coupling the cathode of said first tube to the cathode of said second tube; means for maintaining said cathodes at desired potentials relative to ground; resonant tuning means disposed between said control electrode of said second electron tube and ground and having resistance means coupling said resonant tuning means to the cathode of said second electron tube, said tuning means being responsive to said undesired carrier frequencies whereby the output of said first electron tube is reduced through said cathode coupling means at said undesired carrier frequencies.

8. A low frequency network having a narrow attenuation band comprising a first electron tube amplifier with an A.-C. modulated carrier signal impressed across the input of said amplifier, a second electron tube amplifier connected in cathode follower relationship with said first electron tube amplifier; a grounded common connection constituting one side of the input to said first electron tube and one side of the output of said second electron tube; resonant circuit feedback means between the control electrode and the grounded output of said second electron tube amplifier; and means including a positive feedback resistance connected between the cathode of said second amplifier and the midpoint of said resonant circuit feedback means for reflecting negative resistance to said resonant circuit at frequencies equal to said carrier frequencies to reduce the gain of said second amplifier solely at said carrier frequencies, whereby the output of the first electron tube amplifier is an attenuated carrier wave.

9. A filter circuit, comprising an electronic device having a cathode, a control electrode and an anode, means for supplying operating potentials to said cathode, control electrode and anode, a feedback resistance disposed between said cathode and ground, said electronic device being adapted to receive an alternating current input signal of varying frequency at its control electrode; and high Q band rejection means connected across the cathode circuit defined by the cathode of said electronic device, said feedback resistance and ground to vary the impedance of said cathode circuit in accordance with the frequency of said input signal, said rejection means comprising a second electronic device cathode coupled to said electronic device and across said feedback resistance and having at least a cathode, a control electrode and an anode, a resonant circuit having inductance shunted by two capacitors in series, and a positive feedback resistance connected between the cathode of said second electronic device and the juncture of said capacitors, one end of said resonant circuit being connected to the control electrode of said second electronic device and the other end being grounded.

References Cited in the file of this patent

UNITED STATES PATENTS

| | | |
|---|---|---|
| 2,298,297 | Jacob | Oct. 13, 1942 |
| 2,304,978 | White et al. | Dec. 15, 1942 |
| 2,555,906 | Van Loon et al. | June 5, 1951 |